(12) United States Patent
Sayed et al.

(10) Patent No.: US 10,516,098 B2
(45) Date of Patent: Dec. 24, 2019

(54) APPARATUS FOR SPIN INJECTION ENHANCEMENT AND METHOD OF MAKING THE SAME

(71) Applicant: Purdue Research Foundation, West Lafayette, IN (US)

(72) Inventors: Shehrin Sayed, West Lafayette, IN (US); Vinh Quang Diep, Santa Clara, CA (US); Kerem Y Camsari, Lafayette, IN (US); Supriyo Datta, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 20 days.

(21) Appl. No.: 15/852,371

(22) Filed: Dec. 22, 2017

(65) Prior Publication Data
US 2018/0182954 A1 Jun. 28, 2018

Related U.S. Application Data

(60) Provisional application No. 62/437,882, filed on Dec. 22, 2016.

(51) Int. Cl.
*H01L 43/04* (2006.01)
*H01L 43/06* (2006.01)
(Continued)

(52) U.S. Cl.
CPC ............... *H01L 43/04* (2013.01); *H01L 43/06* (2013.01); *H01L 43/10* (2013.01); *H01L 43/14* (2013.01);
(Continued)

(58) Field of Classification Search
CPC ......... H01L 43/04; H01L 43/06; H01L 43/10; H01L 43/14; H01F 10/3286; H01F 10/329; H01F 41/302
See application file for complete search history.

(56) References Cited

U.S. PATENT DOCUMENTS 9,128,142 B1 * 9/2015 Qu .................... G01R 33/1284
9,865,713 B2 1/2018 Habib et al.
(Continued)

FOREIGN PATENT DOCUMENTS

WO WO 2013025994 2/2013

OTHER PUBLICATIONS

Nan et al.; "Comparison of spin-orbit torques and spin pumping across NiFe/Pt and NiFe/Cu/Pt interfaces"; American Physical Society; Physical Review; 2015; B 91, 214416.
(Continued)

*Primary Examiner* — Peter Bradford
(74) *Attorney, Agent, or Firm* — Piroozi-IP, LLC

(57) ABSTRACT

A switching device is disclosed. The switching device includes a spin-orbit coupling (SOC) layer, a pure spin conductor (PSC) layer disposed atop the SOC layer, a ferromagnetic (FM) layer disposed atop the PSC layer, and a normal metal (NM) layer sandwiched between the PSC layer and the FM layer. The PSC layer is a ferromagnetic insulator (FMI) is configured to funnel spins from the SOC layer onto the NM layer and to further provide a charge insulation so as to substantially eliminate current shunting from the SOC layer while allowing spins to pass through. The NM layer is configured to funnel spins from the PSC layer into the FM layer.

10 Claims, 18 Drawing Sheets

(51) Int. Cl.
*H01L 43/10* (2006.01)
*H01L 43/14* (2006.01)
*H01F 41/30* (2006.01)
*H01F 10/32* (2006.01)

(52) U.S. Cl.
CPC ........ *H01F 10/329* (2013.01); *H01F 10/3286* (2013.01); *H01F 41/302* (2013.01)

(56) References Cited

U.S. PATENT DOCUMENTS

| | | | |
|---|---|---|---|
| 2011/0075476 A1* | 3/2011 | Kajiwara | H01F 10/24 365/170 |
| 2012/0012956 A1* | 1/2012 | Saitoh | B82Y 25/00 257/427 |
| 2014/0224293 A1* | 8/2014 | Kirihara | H01L 37/00 136/205 |
| 2015/0200003 A1 | 7/2015 | Buhrman et al. | |
| 2015/0236246 A1* | 8/2015 | Ishida | H01L 43/04 257/421 |
| 2016/0169988 A1* | 6/2016 | Sirringhaus | G01R 33/1284 324/251 |
| 2016/0276006 A1* | 9/2016 | Ralph | G11C 11/18 |
| 2017/0104150 A1* | 4/2017 | Shi | H01L 43/04 |
| 2017/0178705 A1* | 6/2017 | Buhrman | H01L 43/08 |
| 2018/0166197 A1* | 6/2018 | Wang | H01F 10/12 |
| 2018/0240964 A1* | 8/2018 | Nikonov | H01L 43/08 |

OTHER PUBLICATIONS

Du et al.; "Enhancement of Pure Spin Currents in Spin Pumping Y3Fe5O12/Cu/Metal Trilayers through Spin Conductance Matching"; American Physical Society; Physical Review Applied; 2014; 1, 044004.

Nguyen et al.; "Enhancement of the anti-damping spin torque efficacy of platinum by interface modification"; Applied Physics Letters; 2015; 106, 222402.

Nan et al; "Interfacial spin-orbit torques probed by dc tuning of magnetic resonance"; 2015.

Wang et al.; "Reduction in critical current density by tuning damping constants of CoFeB for spin-torque-transfer switching"; Journal of Physics D: Applied Physics2009; 42.

Deorani et al.; "Role of spin mixing conductance in spin pumping: Enhancement of spin pumping efficiency in Ta/Cu/Py structures"; Applied Physics Letters; 2013; 103, 232408.

Yang et al.; "Giant spin-accumulation signal and pure spin-current-induced reversible magnetization switching"; Nat. Phys.; 2008; pp. 851-854; vol. 4, No. 11.

Erve et al., "Information processing with pure spin currents in silicon: spin injection, extraction, manipulation, and detection"; Electron Devices; Transactions on, vol. 56, No. 10, pp. 2343-2347, 2009.

* cited by examiner

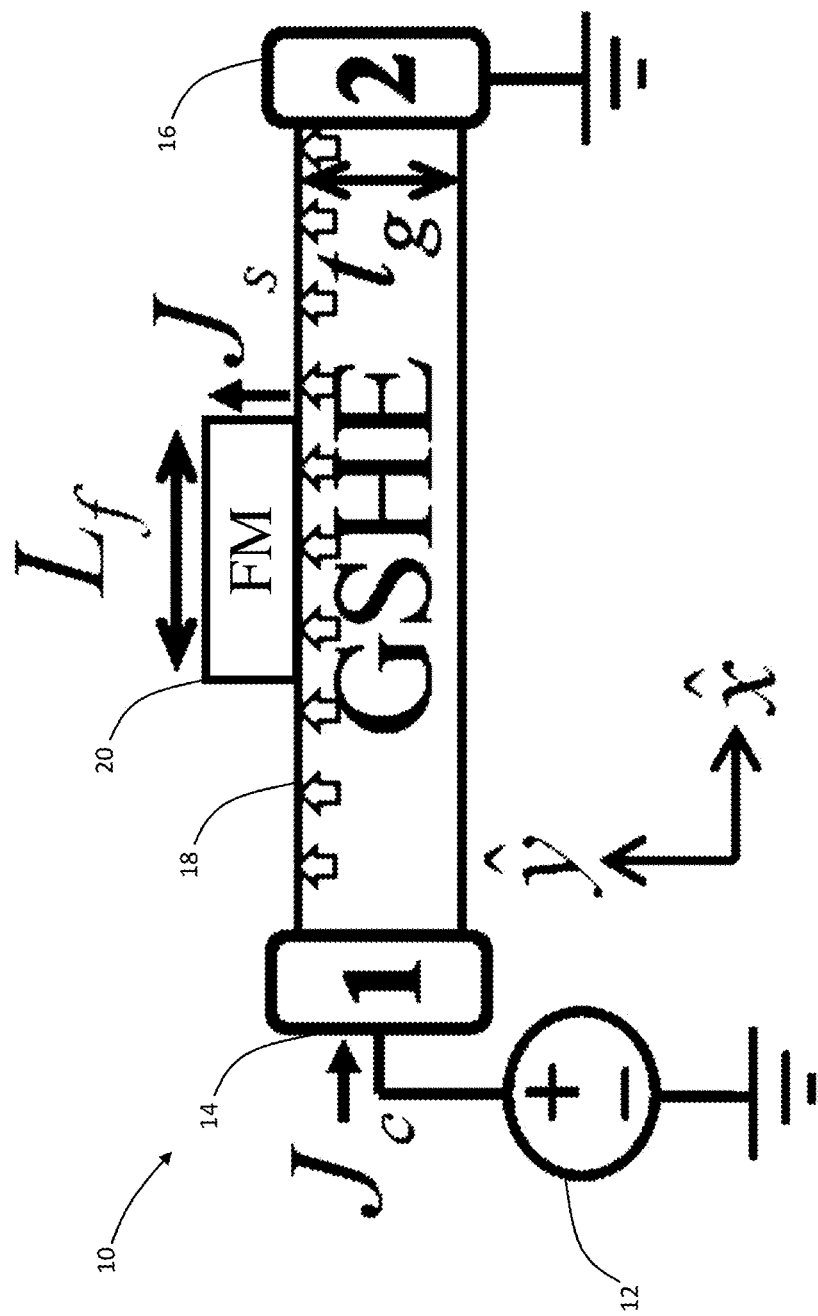
FIG. 1A – Prior Art

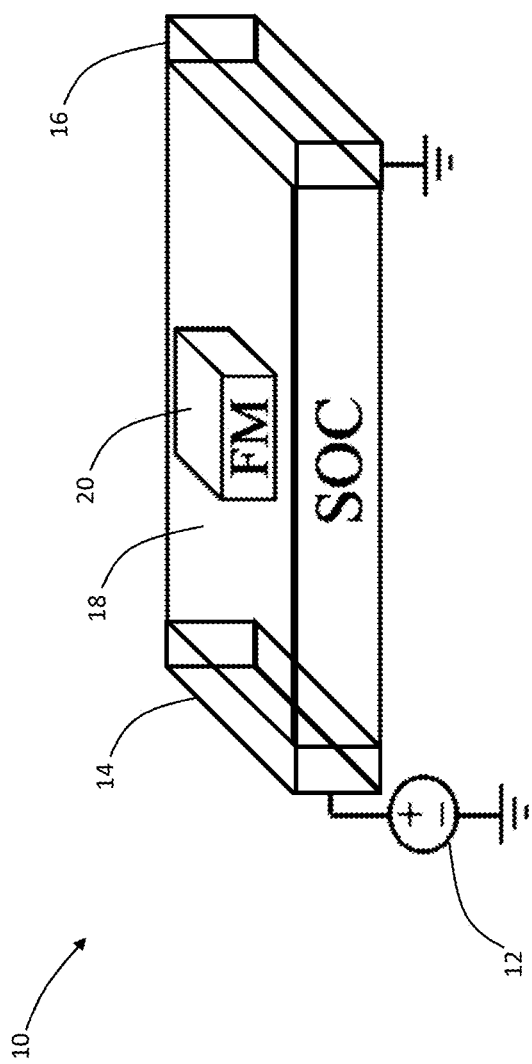

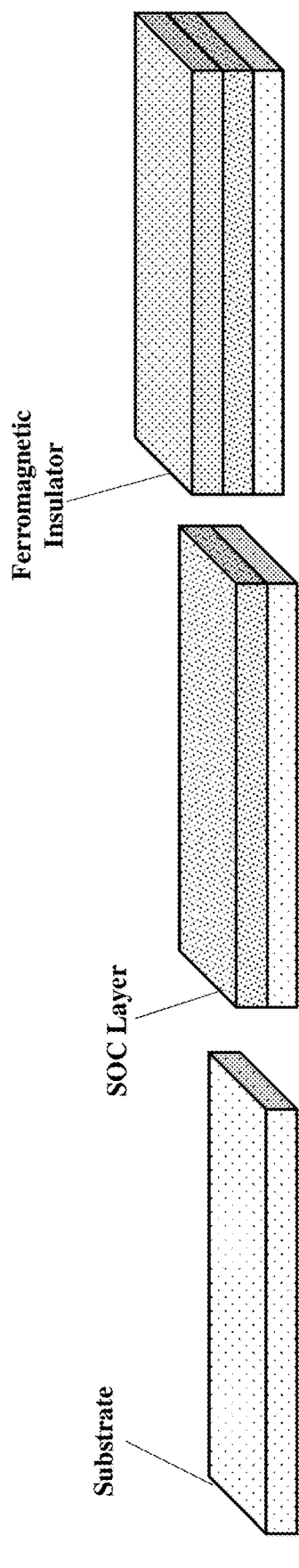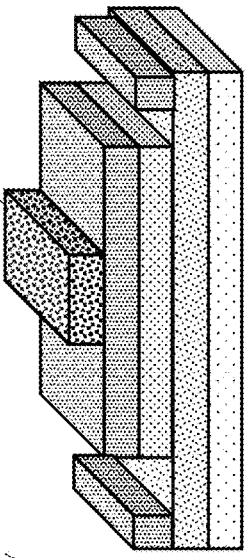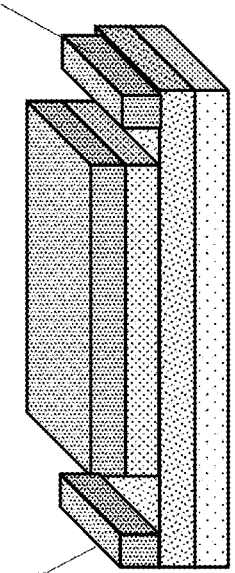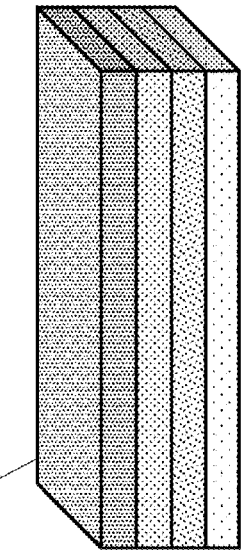
FIG. 7A FIG. 7B FIG. 7C FIG. 7D FIG. 7E FIG. 7F

APPARATUS FOR SPIN INJECTION ENHANCEMENT AND METHOD OF MAKING THE SAME

CROSS REFERENCE TO RELATED APPLICATIONS

The present application is related to and claims the priority benefit of the U.S. Provisional Patent Application Ser. No. 62/437,882 filed Dec. 22, 2016, the contents of which is hereby incorporated by reference in its entirety into this disclosure.

GOVERNMENT SUPPORT CLAUSE

This invention was made with government support under EEC-1227020 awarded by the National Science Foundation. The government has certain rights in the invention.

TECHNICAL FIELD

The present application relates to electronic switching and memory devices, and specifically to devices which incorporate spin-orbit coupling (SOC) materials to achieve switching and memory storage.

BACKGROUND

This section introduces aspects that may help facilitate a better understanding of the disclosure. Accordingly, these statements are to be read in this light and are not to be understood as admissions about what is or is not prior art.

Magnetization switching with high spin-orbit coupling (SOC) materials such as the giant spin Hall effect (GSHE) metals and topological insulator surface states have attracted much attention for potential memory and logic device applications. In such materials, a longitudinal charge current density ($J_c$) induces a transverse spin current density which if large enough can switch magnetization direction of a ferromagnet (FM). The ratio of spin current density ($J_s$) injected into a spin load to $\theta_{SH}J_c$ is given by $$\frac{J_s}{\theta_{SH}J_c} = \left(1 - \operatorname{sech}\frac{t_g}{\lambda_g}\right)\frac{G'_L}{\frac{\sigma_g}{\lambda_g}\tanh\frac{t_g}{\lambda_g} + G'_L}, \quad (1)$$

where $t_g$ is the thickness of the GSHE layer,
$\lambda_g$ is the spin diffusion length,
$\sigma_g$ is the conductivity, and
$\theta_{SH}$ is the intrinsic spin Hall angle of GSHE. $G'_L$ is the spin conductance per unit area of the spin load. Referring to FIGS. 1A and 2A, a side view and perspective view, respectively, of a prior art switching device having a spin-orbit coupling layer and a ferromagnetic layer is depicted.

The right-hand side consists of two factors each of which has a maximum value of one. Therefore, $J_s/(\theta_{SH}J_c) \leq 1$. The first term is $(1-\operatorname{sech} t_g/\lambda_g)$ which represents the cancellation from oppositely spin polarized back surface. This term can be maximized by using thick layers ($t_g \gg \lambda_g$). The second term is:

$$\frac{G'_L}{\frac{\sigma_g}{\lambda_g}\tanh\frac{t_g}{\lambda_g} + G'_L}$$

which is maximized if $G'_L \gg (\sigma_g/\lambda_g)$.

Even under optimal conditions the maximum spin current density, $J_s$, which is limited by $\theta_{SH}J_c$ (since $J_s < \theta_{SH}J_C$). As a result, the present direction of research and development in this field is based on finding materials with increased spin Hall angle $\theta_{SH}$. However, this direction has resulted in limited success.

There is, therefore, an unmet need to find a new and novel approach to increase spin current density to effect switching polarity of ferromagnetic material with smaller charge current density.

SUMMARY

In accordance with one embodiment, a switching device is disclosed. The switching device includes a spin-orbit coupling (SOC) layer, a ferromagnetic (FM) layer, and a normal metal (NM) layer sandwiched between the SOC layer and the FM layer. The NM layer is configured to funnel spins from a large area of the SOC layer into a small area of the FM layer.

In accordance with another embodiment, another switching device is disclosed. The switching device includes a spin-orbit coupling (SOC) layer, a pure spin conductor (PSC) layer disposed atop the SOC layer, and a ferromagnetic (FM) layer disposed atop the PSC layer. The PSC layer is a ferromagnetic insulator (FMI) configured to funnel spins from the SOC layer onto the FM layer and to further provide a charge insulation so as to substantially eliminate current shunting from the SOC layer while allowing spins to pass through.

In accordance to yet another embodiment of the disclosure, a method of making the devices disclosed herein is disclosed. The method includes providing a substrate, applying a spin-orbit coupling (SOC) layer atop the substrate, applying a pure spin conductor (PSC) layer atop the SOC layer, generating an intermediate device, patterning the intermediate device so that the area of the PSC layer is a fraction of the area of the SOC layer, applying a first terminal disposed near a first end of the SOC layer and a second terminal disposed near a second end of the SOC layer, and applying a ferromagnetic (FM) layer disposed atop the PSC layer. The PSC layer is a ferromagnetic insulator (FMI) configured to funnel spins from the SOC layer onto the FM layer and to further provide a charge insulation so as to substantially eliminate current shunting from the SOC layer while allowing spins to pass through.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 1A depicts a side view of a prior art switching device having a spin-orbit coupling (SOC) layer shown as a Giant Spin Hall Effect (GSHE) layer and a ferromagnetic (FM) layer.

FIG. 2A depicts a perspective view of the device of FIG. 1A.

FIGS. 7A-7F are perspective views of starting, intermediate, and final structures of the devices disclosed herein showing the fabrications steps of FIG. 6.

Figure 1B:
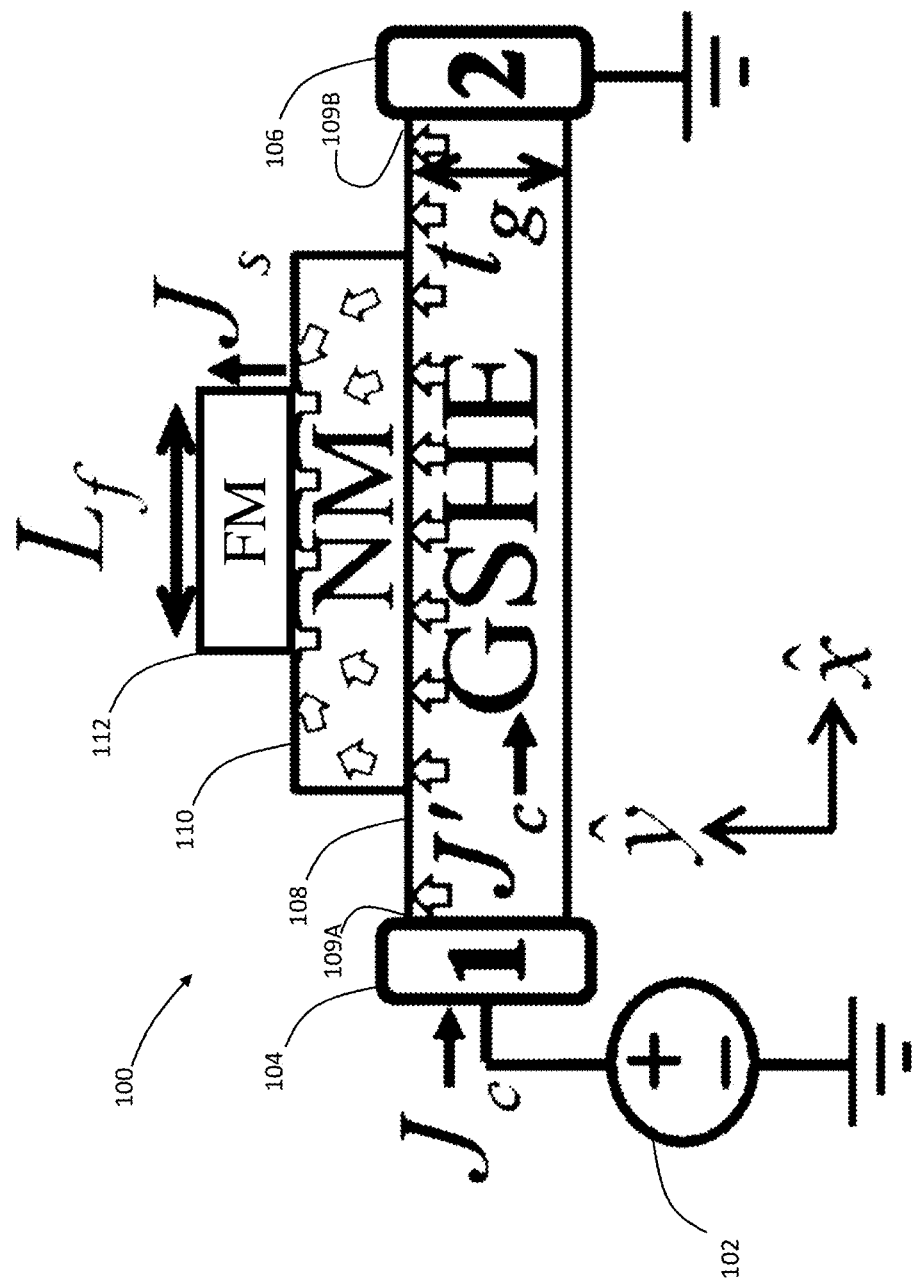
FIG. 1B depicts a side view of a switching device according to one embodiment of the present disclosure wherein a normal metal (NM) layer is sandwiched between the SOC layer and the FM layer of FIG. 1A.

The attached drawings are for purposes of illustration and are not necessarily to scale.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 10%, within 5%, or within 1% of a stated value or of a stated limit of a range.

In the present disclosure the term "substantially" can allow for a degree of variability in a value or range, for example, within 90%, within 95%, or within 99% of a stated value or of a stated limit of a range.

Figure 2B:
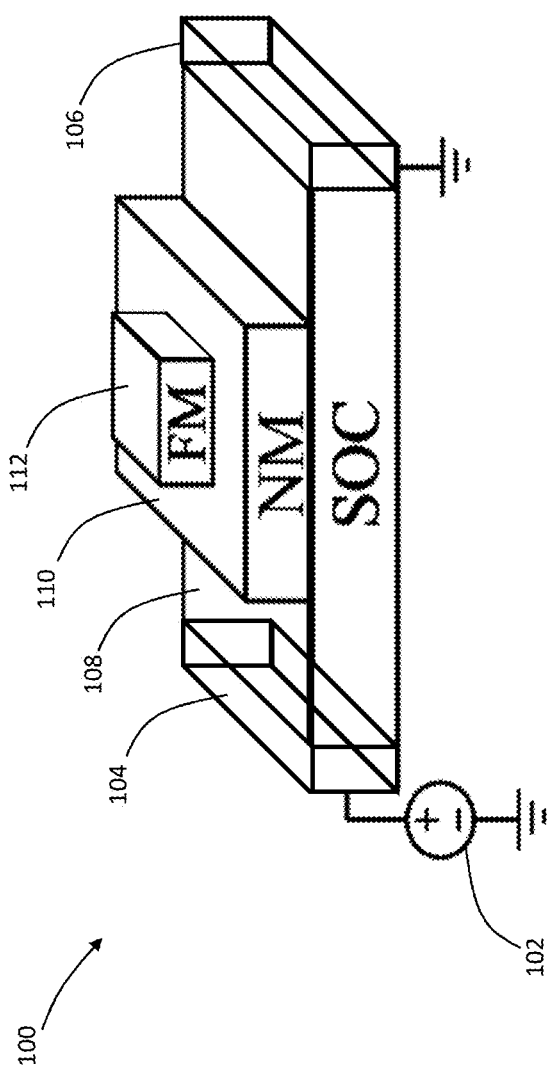
FIG. 2B depicts a perspective view of the device of FIG. 1B.

Referring to FIGS. 1B and 2B, a side view and a perspective view of a switching device 100 according to one embodiment of the present disclosure is presented. In FIG. 1B, the switching device 100 is coupled to a power source 102 in order to receive a longitudinal charge current density ($J_c$) which is converted into a spin current density ($J_s$) which is injected into a spin load of the switching device 100. The switching device 100 includes a first terminal 104 and a second terminal 106. Between the first and second terminals 104 and 106, is a spin-orbit coupling (SOC) layer shown as including a Giant Spin Hall Effect (GSHE) layer 108, according to the embodiment shown. The terminal 104 is disposed near a first end 109A of the GHSE layer 108 and the terminal 106 is disposed near a second end 109B of the GHSE layer 108. The power source 102 can be a voltage source or a current source which is applied across the terminals 104 and 106 as shown to inject a charge current in the GSHE layer 108 along the x-direction.

Disposed adjacent and atop the GSHE layer 108 is a normal metal (NM) layer 110. The surface area of the NM layer 110 is a fraction of the area of the GSHE layer 108. In the embodiment shown in FIGS. 1B and 2B, the NM layer 110 is centrally disposed atop the GSHE layer 108, however, such disposition is optional and other placements are possible. Disposed adjacent and atop the NM layer 110 is a ferromagnetic (FM) layer 112. The surface area of the FM layer 112 is a fraction of the area of the NM layer 110. In the embodiment shown in FIGS. 1B and 2B, the FM layer 112 is centrally disposed atop the NM layer 110, however, such disposition is optional and other placements are possible.

As shown in FIG. 1B, the NM layer 110 funnels spins from a large area of the GSHE layer 108 into a small area of the FM layer 112 provided that the NM layer 110 has a large spin diffusion length ($\lambda_n$) and low resistivity of between about $1.5 \times 10^{-8}$ Ω·m. to about $3.0 \times 10^{-8}$ Ω·m. (e.g. copper, aluminum, silver, gold, or other metals of low resistivity known to a person having ordinary skill in the art).

The spin-orbit coupling layer may comprise a transition metal (e.g., tungsten, tantalum, platinum, or other metals exhibiting GSHE known to a person having ordinary skill in the art), a topological insulator (e.g., $Bi_2Se_3$, $Bi_2Te_3$, $Sb_2Te_3$, $(Bi_{0.5}Sb_{0.5})_2Te_3$, α-Sn or other topological insulators known to a person having ordinary skill in the art), a III-V semiconductor (e.g., InAs, GaAs, or other semiconductor exhibiting spin-momentum locking known to a person having ordinary skill in the art), or a perovskites oxide (e.g. $LaAlO_3|SrTiO_3$ interface, $SrIrO_3$ or any oxides showing spin-momentum locking known to a person having ordinary skill in the art).

Figure 3A:
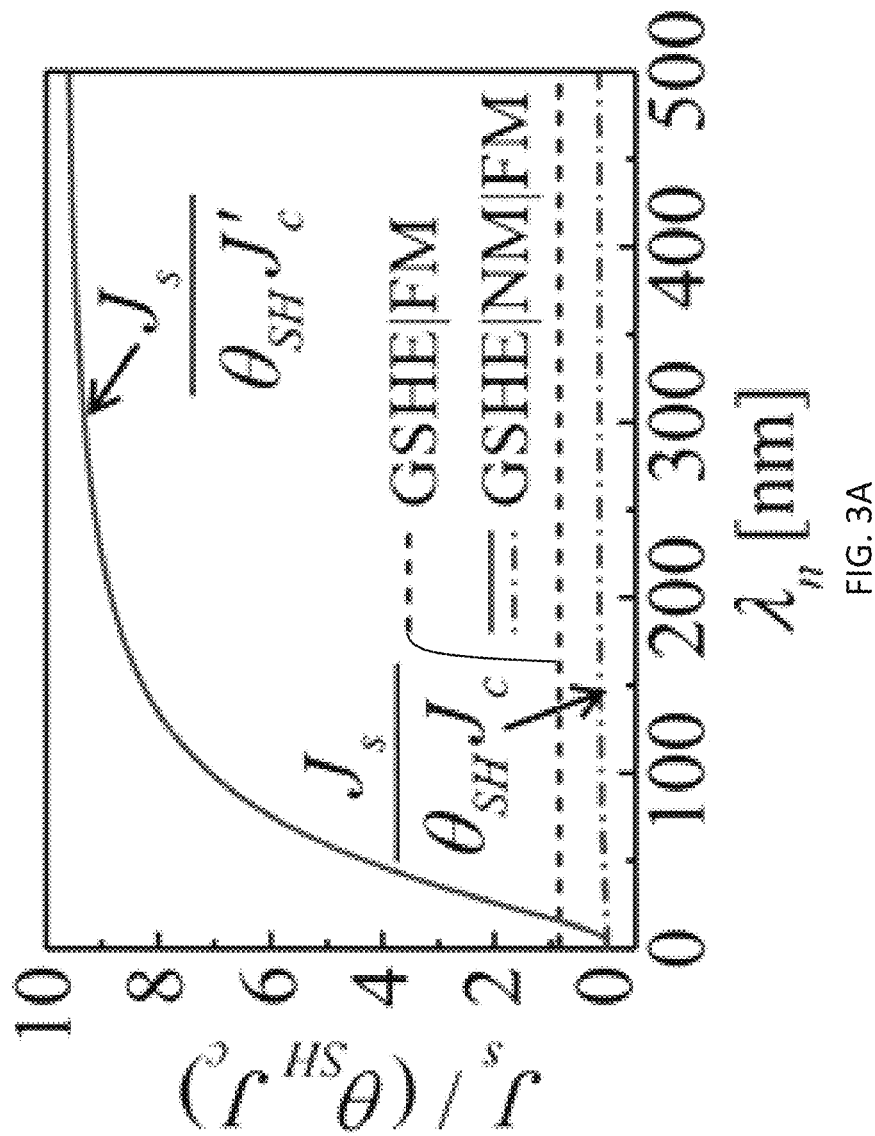
FIG. 3A is a graph of $J_s/(\theta_{SH}J_c)$ as a function of spin diffusion length $\lambda_n$ in accordance to the embodiment shown in FIGS. 1B and 2B, where $J_c$ represents injected longitudinal charge current density which induces a transverse spin current density $J_s$.

Referring to FIG. 3A, a graph of $J_s/(\theta_{SH}J_c)$ is shown as a function of spin diffusion length $\lambda_n$. The structure shown in FIG. 1B, provides an increase in $J_s$ relative to $\theta_{SH}J'_c$ (as shown by the curve in FIG. 3A) where $J'_c$ is the charge current density flowing in the GSHE layer 108 and shows a decrease in $J_s$ relative to $\theta_{SH}J_c$ (dash-dot curve in FIG. 3A) where $J_c$ is the total charge current density flowing in through the terminals 104 and 106. This decrease is because the NM layer 110 that funnels the spin current also provides a shunt path to the charge current. In addition, there is a large component of the charge current outside the GSHE layer 108 which does not generate spin currents.

Figure 1C:
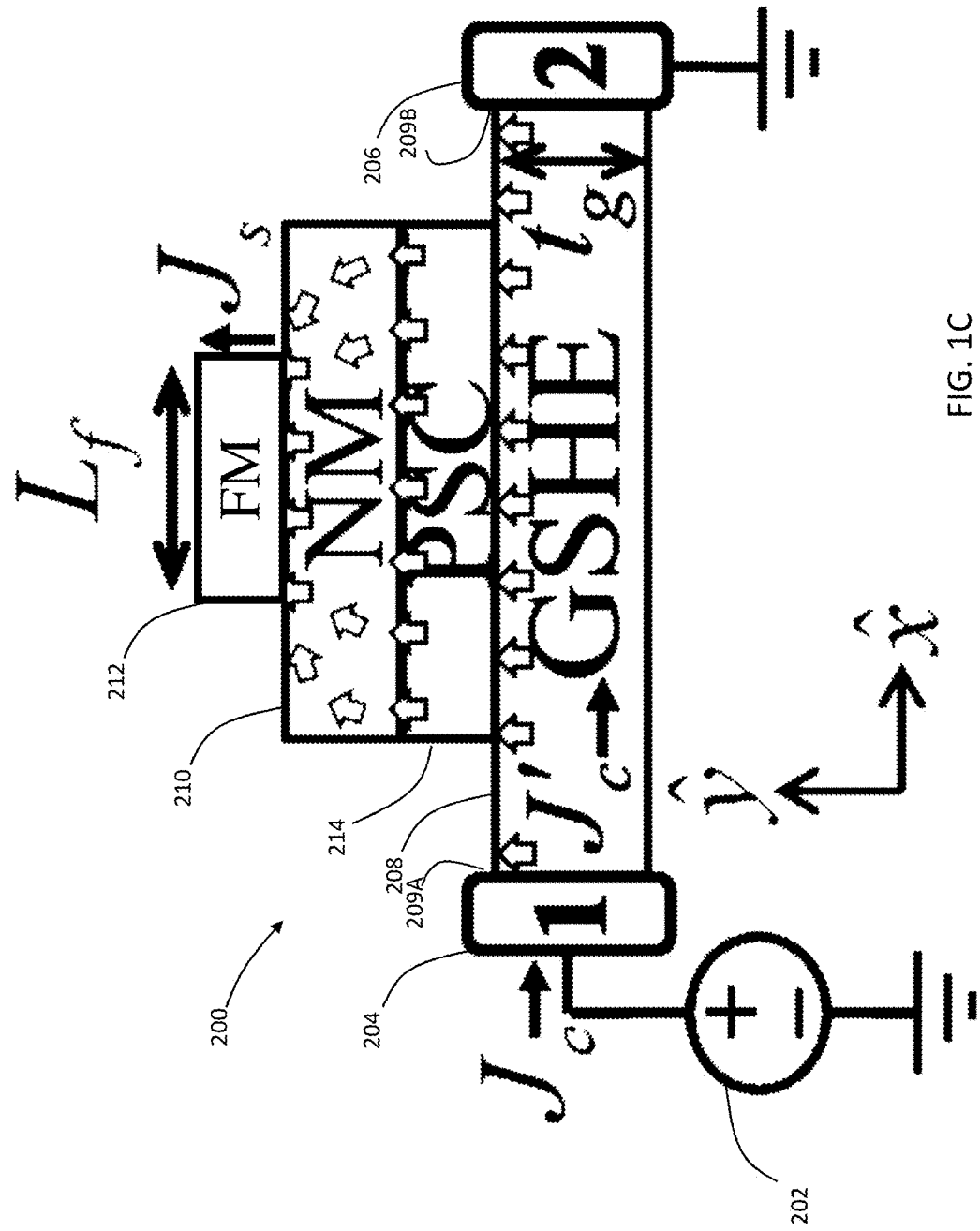
FIG. 1C depicts a side view of a switching device according to a further embodiment of the present disclosure wherein a pure spin conductor (PSC) layer is sandwiched between the NM layer and the SOC layer of FIG. 1B.
Figure 2C:
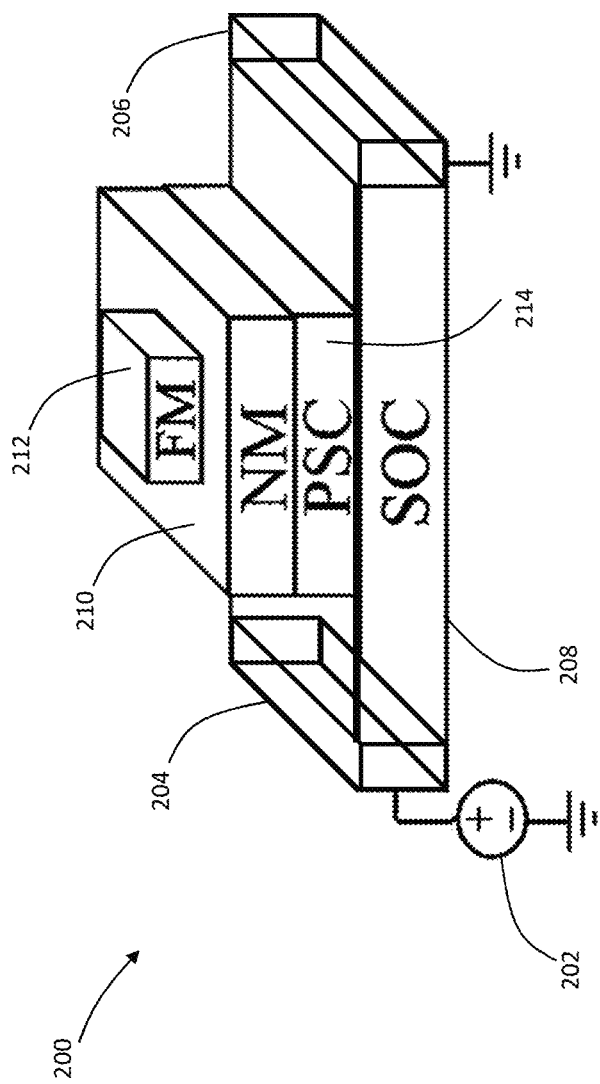
FIG. 2C depicts a perspective view of the device of FIG. 1C.

To alleviate this effect, a pure spin conduction (PSC) layer belonging to a class of ferromagnetic insulators (FMI), e.g., yttrium-iron-granet, which may be included in the structure and sandwiched between the NM layer and the GSHE layer. This configuration is shown in FIG. 1C. Referring to FIGS. 1C and 2C, a side view and a perspective view of a switching device 200 according to another embodiment of the present disclosure is presented. In FIG. 1C, the switching device 200 is coupled to a power source 202 in order to receive a longitudinal charge current density ($J_c$) which is converted into a spin current density ($J_s$) which is injected into a spin load of the switching device 200. The switching device 200 includes a first terminal 204 and a second terminal 206. Between the first and second terminals 204 and 206, is a spin-orbit coupling (SOC) layer shown as including a Giant Spin Hall Effect (GSHE) layer 208, according to the embodiment shown. The terminal 204 is disposed near a first end 209A of the GHSE layer 208 and the terminal 206 is disposed near a second end 209B of the GHSE layer 208. The power source 202 can be a voltage source or a current source which is applied across the terminals 204 and 206 as shown to inject a charge current in the GSHE layer 208 along the x-direction.

Disposed adjacent and atop the GSHE layer 208 is a pure spin conductor (PSC) layer 214. The surface area of the PSC layer 214 is a fraction of the area of the GSHE layer 208. In the embodiment shown in FIGS. 1C and 2C, the PSC layer 214 is centrally disposed atop the GSHE layer 208, however, such disposition is optional and other placements are possible.

Disposed adjacent and atop the PSC layer 214 is a normal metal (NM) layer 210. In the embodiment depicted in FIGS. 1C and 2C, the surface area of the NM layer 210 is about the same as the area of the PSC layer 214, however, this is optional, such that the surface area of the NM layer 210 can be a fraction of the surface area of the PSC layer 214. In the embodiment shown in FIGS. 1C and 2C, given the surface areas of the two layers are about the same, the NM layer 210 is centrally disposed atop the PSC layer 214, however, such disposition is optional and other placements are possible.

Disposed adjacent and atop the NM layer 110 is a ferromagnetic (FM) layer 212. The surface area of the FM layer 212 is a fraction of the area of the NM layer 210. In the embodiment shown in FIGS. 1C and 2C, the FM layer 212 is centrally disposed atop the NM layer 210, however, such disposition is optional and other placements are possible.

As shown in FIG. 1C, the NM layer 210 receives spins from the PSC layer 214 and funnels spins from a large area of the GSHE layer 208 into a small area of the FM layer 212 provided that the NM layer 210 has a large spin diffusion length ($\lambda_n$) and low resistivity of between about $1.5 \times 10^{-8}$ $\Omega \cdot m$. to about $5.2 \times 10^{-8}$ $\Omega \cdot m$. (e.g. copper, aluminum, silver, gold, or other metals of low resistivity known to a person having ordinary skill in the art).

The spin-orbit coupling layer may comprise a GHSE metal (e.g., tungsten, tantalum, platinum, or other GSHE metals known to a person having ordinary skill in the art), although other materials (e.g., topological insulators, Rashba interfaces, two-dimensional electron gas in semiconductors showing Rashba effect) may also be used.

The added PSC layer 214, substantially reduces the shunt path to the charge current, as described below, thereby reducing the effect seen in FIG. 3A. The pure spin conduction layer can be implemented with a thin layer of FMI (for example, yttrium-iron-granet (YIG)) layer. Because of pure spin conduction in ferromagnetic insulators, which do not allow charge currents to flow, but nevertheless allow spin currents (whose polarization is longitudinal to the net magnetization direction of the FMI layer) to flow through magnon generation, the PSC layer prevents the current shunting effect of the NM layer.

Pure spin conduction materials may be described by a conductance matrix of the following form:

$$\begin{pmatrix} I_c \\ I_s \end{pmatrix} = \begin{bmatrix} 0 & 0 \\ 0 & G_S \end{bmatrix} \begin{pmatrix} V_c \\ V_s \end{pmatrix}, \quad (2)$$

where $I_c$, $I_s$ are terminal charge, spin currents and $V_c$, $V_s$ are terminal charge, spin voltages. Based on available experimental data, a spin circuit model for such pure spin conductors (PSC), which was used in conjunction with other models for the GSHE, NM, and FM layers to obtain the result in FIG. 1C. showed an increase in $J_s$ by a factor of about 7. It should be appreciated that the presently disclosed embodiments are two dimensional, which ignored the spin diffusion along the direction perpendicular to the page. For three dimensional structures, the increase will be larger. This thin layer of FMI material (PSC layer 214, 314) provides an improved spin transmission.

Note that in FIG. 1C, the increase is with respect to the total charge current density ($J_c$), so that one could view the composite GSHE|PSC|NM as an effective material whose "effective" spin Hall angle is about 7 times larger than that of the GSHE. This represents a significant increase and even larger increases are possible with three dimensional funneling.

Figure 1D:
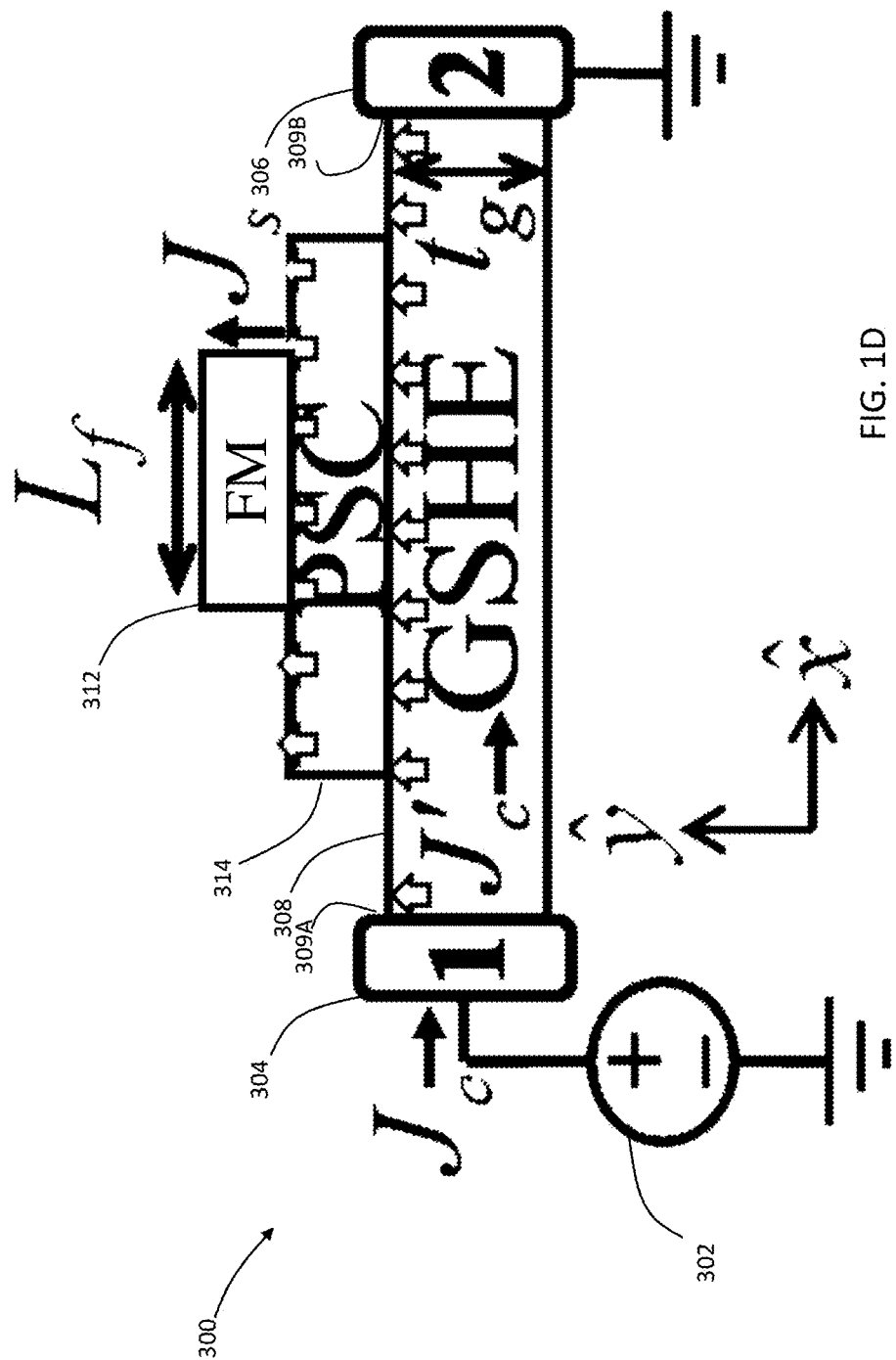
FIG. 1D depicts a side view of a switching device according to a further embodiment of the present disclosure wherein a pure spin conductor (PSC) layer is sandwiched between the FM layer and the SOC layer of FIG. 1A.
Figure 2D:
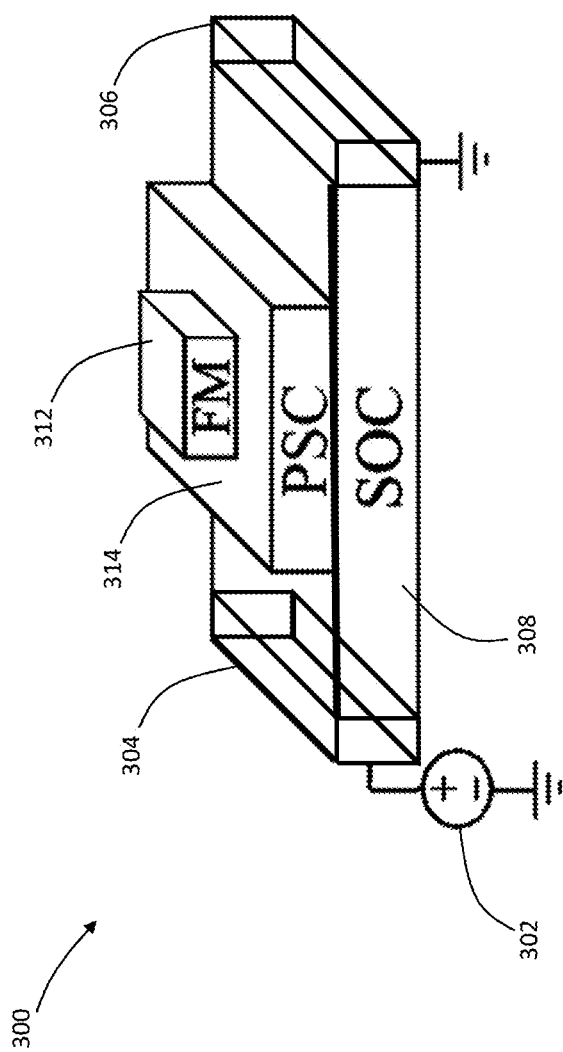
FIG. 2D depicts a perspective view of the device of FIG. 1D.
Figure 3B:
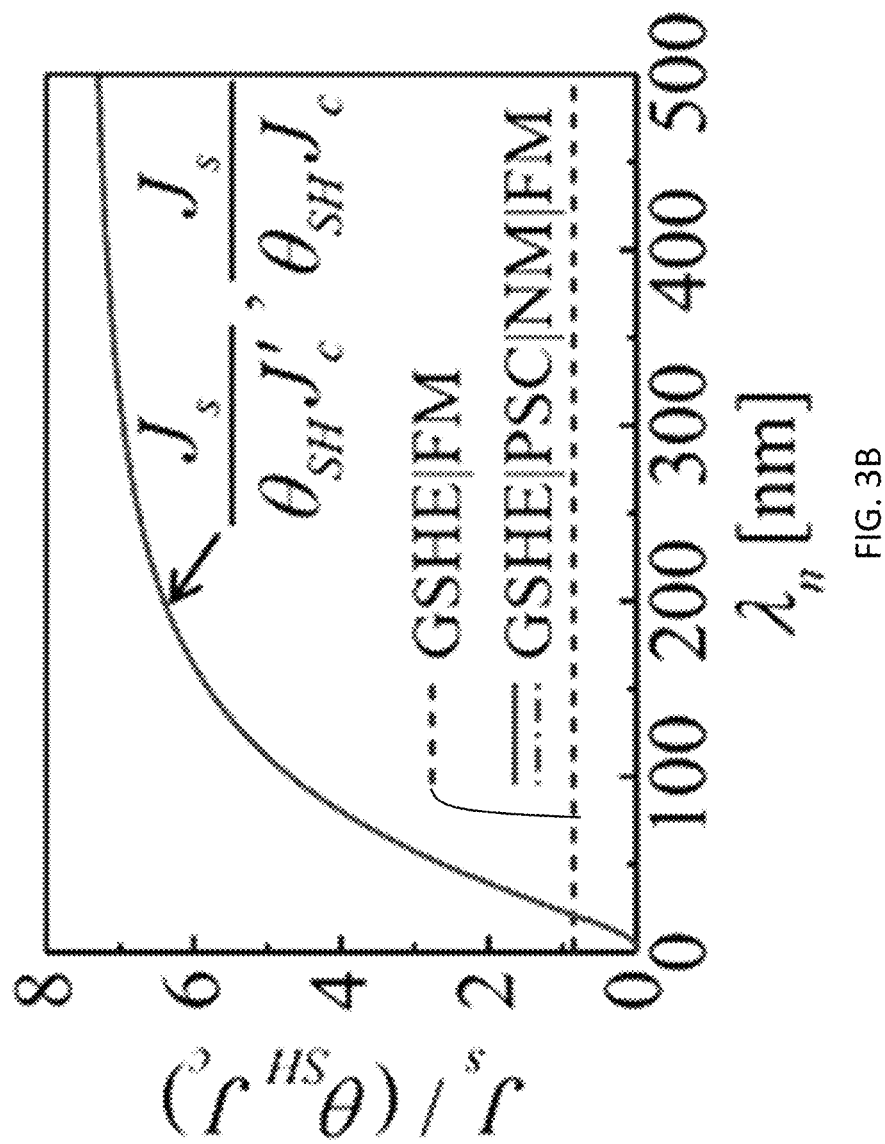
FIG. 3B is a graph of $J_s/(\theta_{SH}J_c)$ as a function of spin diffusion length $\lambda n$ in accordance to the embodiment shown in FIGS. 1C and 2C, where $J_c$ represents injected longitudinal charge current density which induces a transverse spin current density $J_s$.

Referring to FIG. 3B, a graph of $J_s/(\theta_{SH}J_c)$ is shown as a function of spin diffusion length of NM layer $\lambda n$. The structure shown in FIG. 1C, provides an increase in $J_s$ relative to $\theta_{SH}J'_c$ (as shown by the curve in FIG. 3B) where $J'_c$ is the charge current density flowing in the GSHE layer 208 and shows a substantially same increase in $J_s$ relative to $\theta_{SH}J_c$ (dash-dot curve in FIG. 3B that is substantially under the solid curve) where $J_c$ is the total charge current density flowing in through the terminals 204 and 206. The difference between FIG. 3B and FIG. 3A is that the NM layer 210 that funnels the spin current no longer provides a shunt path to the charge current, by the introduction of the PSC layer 214, without which the reduction in $J_s/(\theta_{SH}J_c)$ is observed as shown in FIG. 3A If the PSC layer has a magnon conductivity and magnon diffusion length higher than or equal to the NM layer, then the FMI itself may be used as a spin funnel layer in certain embodiments as shown in FIGS. 1D and 2D. Referring to FIGS. 1D and 2D, a side view and a perspective view of a switching device 300 according to another embodiment of the present disclosure is presented. In FIG. 1D, the switching device 300 is coupled to a power source 302 in order to receive a longitudinal charge current density ($J_c$) which is converted into a spin current density ($J_s$) which is injected into a spin load of the switching device 300. The switching device 300 includes a first terminal 304 and a second terminal 306. Between the first and second terminals 304 and 306, is a spin-orbit coupling (SOC) layer shown as including a Giant Spin Hall Effect (GSHE) layer 308, according to the embodiment shown. The terminal 304 is disposed near a first end 309A of the GHSE layer 308 and the terminal 306 is disposed near a second end 309B of the GHSE layer 308. The power source 302 can be a voltage source or a current source which is applied across the terminals 304 and 306 as shown to inject a charge current in the GSHE layer 308 along the x-direction.

Disposed adjacent and atop the GSHE layer 308 is a pure spin conductor (PSC) layer 314. The surface area of the PSC layer 314 is a fraction of the area of the GSHE layer 308. In the embodiment shown in FIGS. 1D and 2D, the PSC layer 314 is centrally disposed atop the GSHE layer 308, however, such disposition is optional and other placements are possible.

Disposed adjacent and atop the PSC layer 314 is a ferromagnetic (FM) layer 312. The surface area of the FM layer 312 is a fraction of the area of the PSC layer 314. In the embodiment shown in FIGS. 1D and 2D, the FM layer 312 is centrally disposed atop the PSC layer 314, however, such disposition is optional and other placements are possible.

As shown in FIG. 1D, the PSC layer 314 receives spins from the GSHE layer 308 and funnels spins from a large area of the GSHE layer 308 into a small area of the FM layer 312 provided that the PSC layer 314 has a large spin diffusion length ($\lambda_n$) and low spin resistivity of between about $1.5 \times 10^{-8}$ Ω·m. to about $5.2 \times 10^{-8}$ Ω·m and behaves as an insulator for charge. The spin resistivity is in the order of resistivity of metals, e.g., copper, aluminum, silver, gold, or other metals of low resistivity known to a person having ordinary skill in the art.

The spin-orbit coupling layer may comprise a GHSE metal (e.g., tungsten, tantalum, platinum, or other GSHE metals known to a person having ordinary skill in the art), although other materials (e.g., topological insulators, Rashba interfaces, two-dimensional electron gas in semiconductors showing Rashba effect) may also be used.

Spin load conductance $G'_L$ is important in limiting the degree of funneling achievable in practice through the second factor in Eq. (1). Usually the FM material has a very high spin conductance, so that $G'K \gg \sigma_g/\lambda_g$. By making the effective GSHE area ($A_g$) larger than the FM area ($A_f$), $\sigma_g A_g/\lambda_g$ is made larger and if it becomes comparable to $G'_L A_f$, the second factor in Eq. (1) will adversely affect spin injection. Consequently, spin funneling is a technique to enhance spin injection into a low spin resistive load $G'_L$ such as FM.

In certain embodiments, the thickness of the SOC layer (e.g., the GSHE layer 108, 208, 308) is greater than the spin diffusion length of the spin-orbit coupling layer in order to avoid cancellation from two oppositely spin polarized surfaces. According to an embodiment, the lateral area (length × width) of the spin-orbit coupling layer is equal to or greater than the lateral area of the NM layer. According to an embodiment, the NM thickness is between about 20 nm to about 1 μm. According to an embodiment, the thickness of the NM layer is substantially equal to a critical thickness for which the spin funneling is maximum. The critical thickness is proportional to the spin diffusion length of the NM layer. In order to have maximum gain through the device, the NM length and width should be greater than or equal to the spin diffusion length of NM layer. According to an embodiment, the lateral area (length × width) of the PSC layer is greater or equal to the lateral area of the NM layer, with both the lateral areas of the PSC layer and NM layer being less than or equal to the lateral area of the spin-orbit coupling layer. According to an embodiment, the thickness of the PSC layer can be between about 1 nm and about 10 μm and is preferably on the order of a few nanometers and in certain embodiments between about 1 and about 10 nanometers (approximately 0.1% of the spin diffusion length of the NM layer). According to an embodiment, the length of the FM layer is smaller than the length of the NM layer to fully utilize the spin funneling effect, with an increased spin funneling effect resulting from a smaller FM layer length with respect to the NM layer. According to an embodiment, the FM layer thickness is small enough to enable spin torque switching.

Figure 4A:
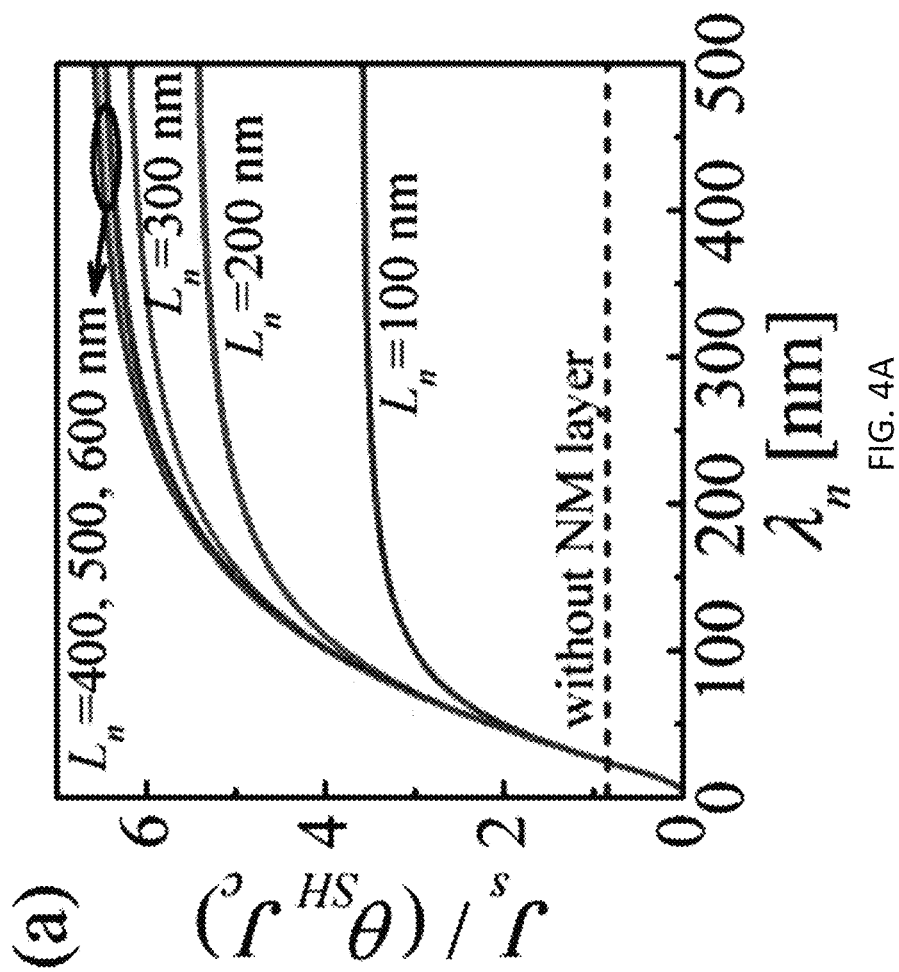
FIG. 4A is a graph of $J_s/(\theta_{SH}J_c)$ as a function of spin diffusion length $\lambda_n$ of the NM layer in accordance to the embodiment shown in FIGS. 1B and 2B, where $J_c$ represents injected longitudinal charge current density which induces a transverse spin current density $J_s$, for different lengths (Ln) of the NM layer, where the NM material is copper.

Referring to FIG. 4A a graph of $J_s/(\theta_{SH}J_c)$ as a function of spin diffusion length $\lambda_n$ of the NM layer in accordance to the embodiment shown in FIGS. 1B and 2B is provided where $J_c$ represents injected longitudinal charge current density which induces a transverse spin current density $J_s$, for different lengths (Ln) of the NM layer, where the NM material is copper. $\lambda_n$ is swept from about 1 nm to about 500 nm for $L_n$ of about 100 nm to about 600 nm. In one embodiment, copper is used as funnel (NM) layer in the result shown and FM is considered as a perfect spin sink. For short length (between about 100 nm to about 300 nm) Cu layer, the enhancement ratio saturates when the length exceeds either $\lambda_n$; or $L_n$ whichever is the smaller. This is because the spin funneling occurs due to the 2D diffusion of spins in bulk NM and spins coming from a distance larger than spin diffusion length get lost in the bulk. For longer Cu lengths (i.e., greater than about 400 nm), the saturation behavior is determined by the mismatch between GSHE source resistance and spin resistance of NM layer, which is related to the resistivity ratio for GSHE and NM (i.e. $\rho_g$ substantially the same as $\rho_n$).

Figure 4B:
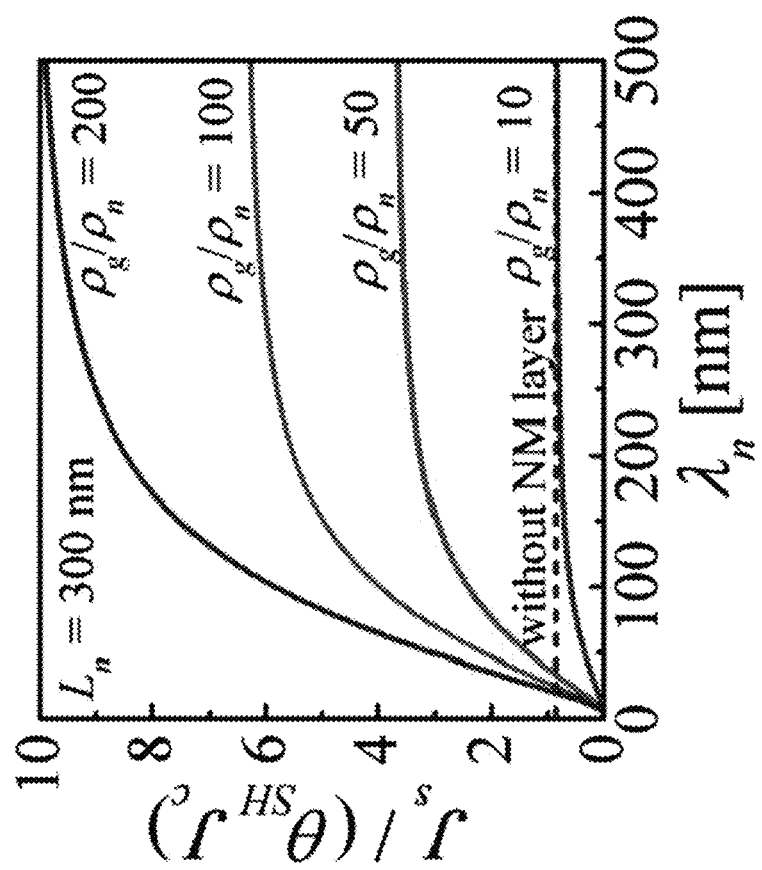
FIG. 4B is a graph of $J_s/(\theta_{SH}J_c)$ as a function of spin diffusion length $\lambda_n$ of the NM layer in accordance to the embodiment shown in FIGS. 1B and 2B for different resistivity ratios of the SOC layer and the NM layer ($\rho_g/\rho_n$) of the NM layer, where $\rho_g$ is the resistivity of the GSHE layer and $\rho_n$ is the resistivity of the NM layer.

FIG. 4B is a graph of $J_s/(\theta_{SH}J_c)$ as a function of spin diffusion length $\lambda_n$ of the NM layer in accordance to the embodiment shown in FIGS. 1B and 2B for different resistivity ratios of the SOC layer and the NM layer ($\rho_g/\rho_n$) of the NM layer, where $\rho_g$ is the resistivity of the GSHE layer and $\rho_g$ is the resistivity of the NM layer. To increase the spin funneling effect, the resistivity of the funnel layer has to be substantially lower than that of the spin source layer (GSHE) i.e. $\rho_g$ substantially higher than $\rho_n$, as shown in FIG. 4B. Large enhancement is observed for a low resistive funnel layer driven by a high resistive GSHE spin source. In one embodiment, the NM length is about 300 nm.

Figure 4C:
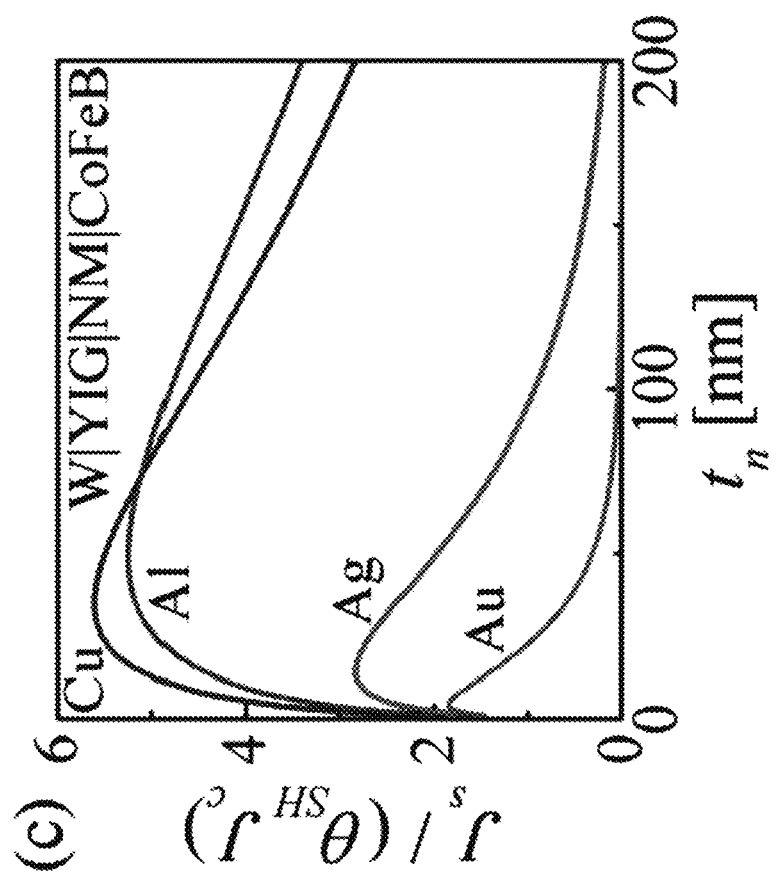
FIG. 4C is a graph of $J_s/(\theta_{SH}J_c)$ as a function of NM layer thickness in accordance to the embodiment shown in FIGS. 1B and 2B for tungsten (w) as the spin source.
Figure 4D:
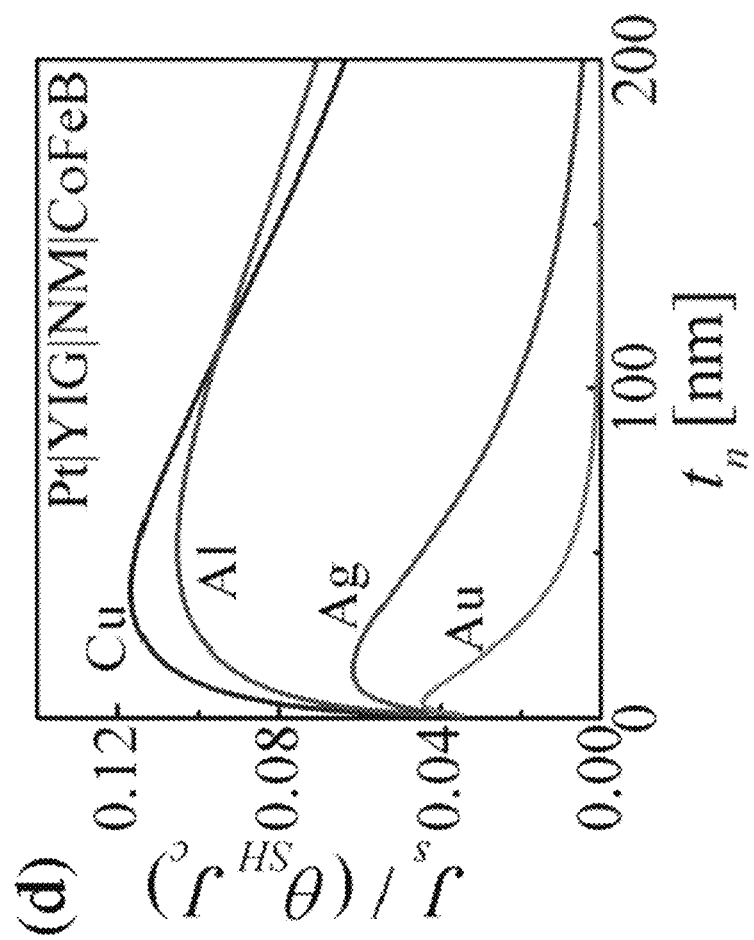
FIG. 4D is a graph of $J_s/(\theta_{SH}J_c)$ as a function of NM layer thickness in accordance to the embodiment shown in FIGS. 1B and 2B for platinum (pt) as the spin source.

FIG. 4C is a graph of $J_s/(\theta_{SH}J_c)$ as a function of NM layer thickness in accordance to the embodiment shown in FIGS. 1B and 2B for tungsten (w) as the spin source. FIG. 4D is a graph of $J_s/(\theta_{SH}J_c)$ as a function of NM layer thickness in accordance to the embodiment shown in FIGS. 1B and 2B for platinum (pt) as the spin source. In the results shown in FIGS. 4C and 4D, and according to one embodiment, CoFeB was used as the FM layer with its magnetization along the x-direction, orthogonal to the spin polarization direction (z-direction) which is being injected into the FM. Thus, we are observing the maximum spin current density absorbed by the FM, which is determined by the real component of the interface spin mixing conductance.

FIGS. 4C and 4D show $J_s/(\theta_{SH}J_c)$ as a function of NM layer thickness ($t_n$) for two different spin sources: tungsten (W) and platinum (Pt) respectively. The resistivity of W (about 200 μΩ-cm) is about an order of magnitude higher than that of Pt (about 24 ρΩ-cm). Enhancement (i.e., substantially higher than 1) caused by spin funneling is observed for the case where W is used as spin source (FIG. 4C) but degradation (i.e., less than 1) is observed for the case where platinum is used as spin source (FIG. 4D).

According to one embodiment, different NM materials are used as funnel layer: copper (Cu), aluminum (Al), silver (Ag), and gold (Au) with resistivities of 2.08, 3.2, 5.5, and 5.2 μΩ-cm respectively and spin diffusion lengths of 500, 600, 152, and 60 nm, respectively. For thicker NM layer, spin funneling ability in different NM materials were used is in the following order: Al>Cu>Ag>Au mostly determined by their spin diffusion length. But for very thin NM layer compared to the spin diffusion length, low resistivity determines high spin funneling. Thus, thin Cu layer shows better funneling than thin Al layer since resistivity of Cu is lower than Al. There exists a critical thickness of the NM layer for which spin funneling is maximum. The critical thicknesses for Cu, Al, Ag, and Au are about 35, 49, 14, and 4 nm, respectively as shown in FIGS. 4C and 4D. NM layers with large spin diffusion length have higher critical thickness.

Figure 5A:
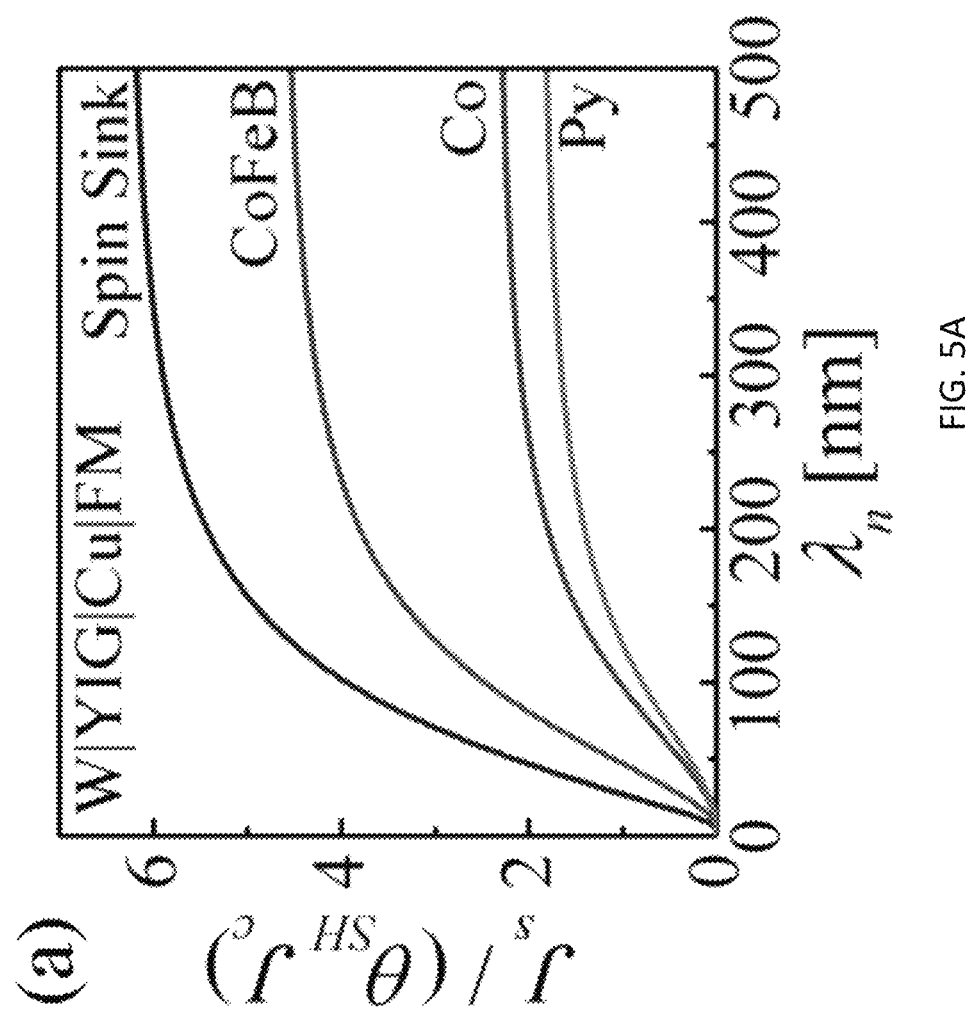
FIG. 5A is a graph of $J_s/(\theta_{SH}J_c)$ as a function of spin diffusion length $\lambda_n$ of the NM layer in accordance to the embodiment shown in FIGS. 1B and 2B for different FM materials.
Figure 5B:
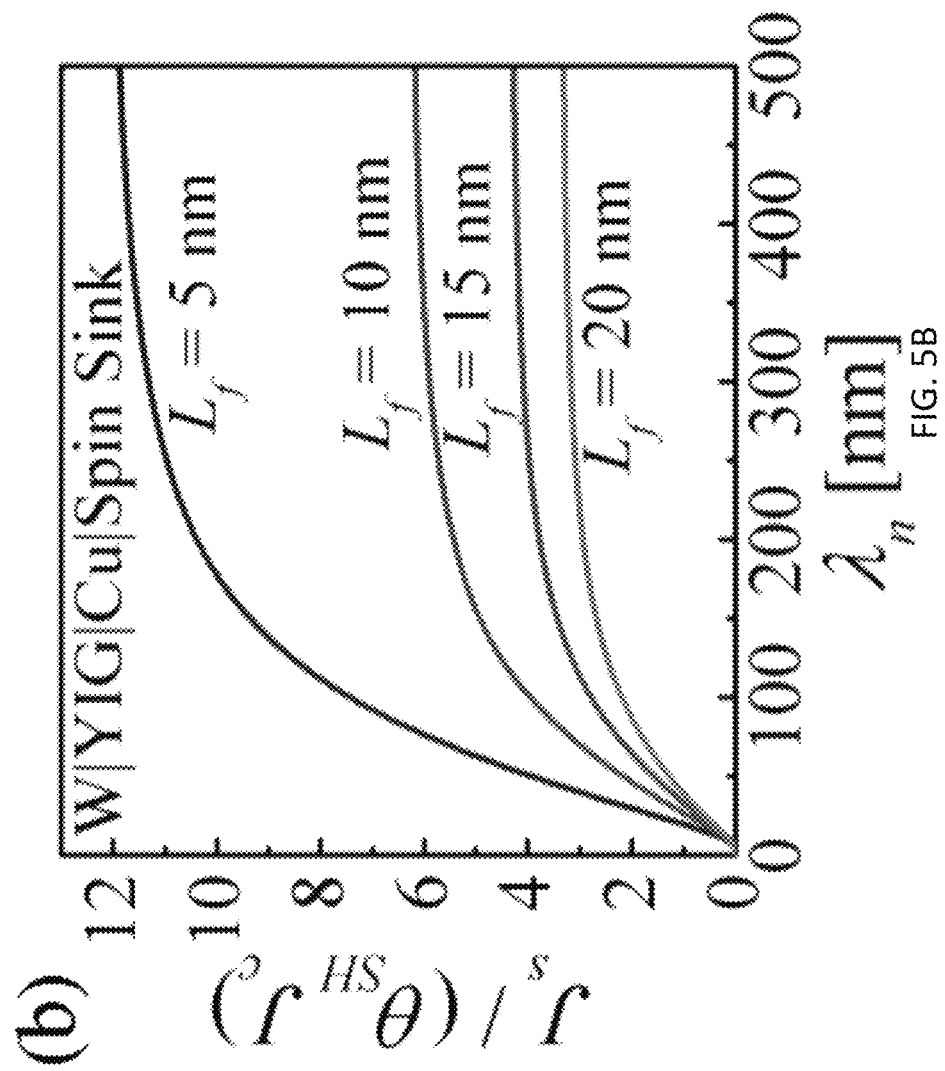
FIG. 5B is a graph of $J_s/(\theta_{SH}J_c)$ as a function of spin diffusion length $\lambda_n$ of the NM layer in accordance to the embodiment shown in FIGS. 1B and 2B for different FM layer lengths.

FIG. 5A is a graph of $J_s/(\theta_{SH}J_c)$ as a function of spin diffusion length $\lambda_n$ of the NM layer in accordance to the embodiment shown in FIGS. 1B and 2B for different FM materials. FIG. 5B is a graph of $J_s/(\theta_{SH}J_c)$ as a function of spin diffusion length $\lambda_n$ of the NM layer in accordance to the embodiment shown in FIGS. 1B and 2B for different FM layer lengths. Spin funneling is a mechanism to enhance spin injection into low spin resistive load like FM. This is because NM layer collects spins from spin source which diffuses towards the lowest spin resistive path and FM acts as a spin sink. Spin funneling will not enhance spin injection into a load which is higher spin resistive than the funnel layer (e.g. semiconductor). FIG. 5A shows the enhancement ratio ($J_s/(\theta_{SH}J_c)$) as a function of NM spin diffusion length for different ferromagnets in W|YIG|Cu|FM structure. The top curve shows the ideal spin sink case where other ferromagnets e.g. CoFeB, Co, Py show lower enhancement based on the real part of interface spin mixing conductance.

Enhancement ratio is higher for FM with smaller length as shown in FIG. 5B and the enhancement doubles if the FM length is cut in half. This is because for fixed longitudinal charge current density in GSHE ($J_c$), the transverse spin current density ($J_s$) injected into the FM is the spin current injected into ($I_s$) per unit area i.e. Js=Is/(WL$_{FM}$), where L$_{FM}$ is the length of the ferromagnet. When GSHE is directly driving a FM, I$_s$ decreases proportional to FM length. Thus Eq. (1) is independent of L$_{FM}$. But in the presence of spin funneling, I$_s$ is kept fixed by the NM parameters. Hence J$_s$ doubles LFM is reduced by half which in turn enhances ratio $J_s/(\theta_{SH}J_c)$ for fixed charge current density. For both FIGS. 5A and 5B, NM length is about 300 nm.

Referring to FIGS. 6 and 7A-7F, a flowchart 400 depicting the steps in making the devices discussed herein, as well as perspective views of the corresponding intermediate structures are provided. As an initial step, a substrate is provided (see FIGS. 6 and 7A). The choice of the substrate (e.g., any amorphous surfaces like oxidized silicon or CoFeB substrate for transitional metal SOC; SiO$_2$|highly doped n-type silicon substrate or epitaxial graphene|SiC(0001) or InP(111)A or GaAs(111)A for topological insulators SOC; TiO$_2$-terminated SrTiO$_3$ single-crystal substrate for oxide interface SOC; semi-insulating InP(001) substrate for III-V semiconductor based quantum-well SOC or other suitable substrates known to a person having ordinary skill in the art) depends on the SOC layer to be provided as discussed below. Next on step 404, the SOC layer is grown or deposited on the substrate (see FIGS. 6 and 7B). The SOC layer comprises materials such as transition metals, topological insulators, III-V semiconductor, perovskites oxides, and other suitable material known to a person having ordinary skill in the art. Transition metals include Pt, Ta, and W can be sputter deposited or evaporated onto amorphous surfaces such as oxidized silicon substrate. High resistive β-phase for Ta or W is desired. Topological insulator include Bi$_2$Se$_3$ can be grown on SiO$_2$|highly doped n-type silicon substrate or epitaxial graphene|SiC(0001) or InP(111)A or GaAs(111)A. Oxide interface such as LaAlO$_3$/SrTiO$_3$ can be fabricated by starting with TiO$_2$-terminated SrTiO$_3$ single-crystal substrate and then growing LaAlO$_3$ film by pulsed laser deposition. III-V semiconductor such as InAs can be used to make a quantum well structure with the stacked layers of InAs, In$_{0.52}$Al$_{0.48}$As, In$_{0.53}$Ga$_{0.47}$As, InAs active layer, In$_{0.53}$Ga$_{0.47}$As, In$_{0.52}$Al$_{0.48}$As, n$^+$ In$_{0.52}$Al$_{0.48}$As carrier supplier, In$_{0.52}$Al$_{0.48}$As buffer grown on a semi-insulating InP (001).

Figure 6:
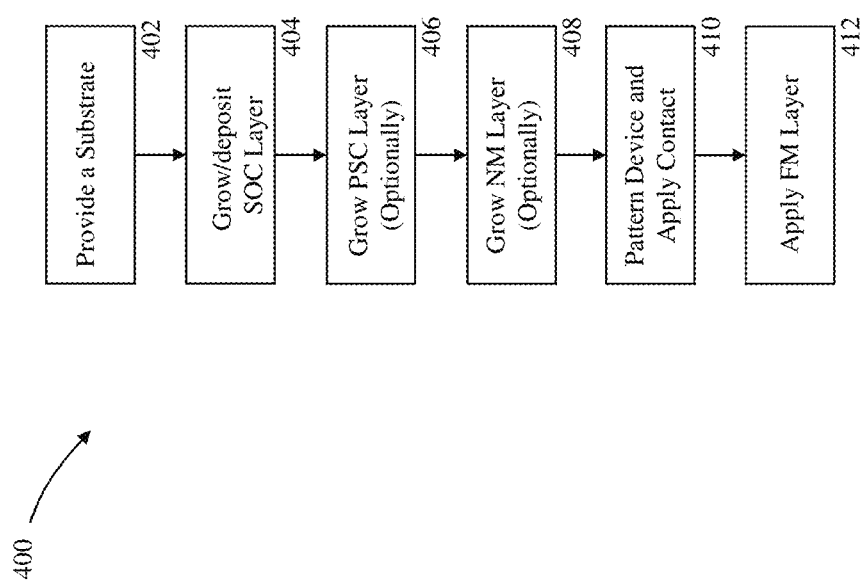
FIG. 6 is a flowchart depicting the steps for fabricating devices of the present disclosure.

Before proceeding to next step in FIG. 6, the native oxide on the SOC layer is removed, so PSC layer and metal contacts are in direct contact, as native oxide can degrade spin injection into the next layer. Next in step 406, the PSC layer is grown (see FIGS. 6 and 7C). The PSC layer can be a ferromagnetic insulator such as yttrium iron garnet (YIG). A thin layer can be grown by pulsed laser deposition under a suitable temperature and pressure (for example, pulse rate can be about 2.5 Hz and temperature can be between about 450 to about 650°Celsius, and pressure can be about 1.5 mTorr). Rapid thermal annealing can be utilized to make YIG film crystalline and magnetized.

Next, in step 408, the NM layer is grown (see FIGS. 6 and 7D). This step is optional as described above, with reference to FIGS. 1C-1D and 2C-2D. The funnel layer (i.e., the NM layer) comprises, e.g., Cu, Al, or other materials known to a person having ordinary skill in the art with low resistivity and high spin diffusion length. This layer can be grown by sputter deposition process, as known to a person having ordinary skill in the art, to generate the intermediate device shown in FIGS. 6 and 7D).

Next, in step 410, the intermediate device shown in FIGS. 6 and 7D is patterned and contacts are applied (see FIGS. 6 and 7E). The intermediate device is patterned with lithography and or lift-off processes and contacts (e.g., normal metal) are then applied on two ends of the SOC layer for charge current injection. The contacts can be composites such as Ta|Cu, Ti|Au, and other suitable materials known to a person having ordinary skill in the art. The contacts can be sputter deposited and patterned. It should be appreciated that the contacts do not touch the funnel NM layer (in the optional case where the NM layer is applied).

Next, in step 412, the FM layer is applied (see FIGS. 6 and 7F). The FM layer which can also be a magnetic tunnel junction device or any magnetoresistive device, provides the functionality of a spin sink and can be used, e.g., as a storage element of a memory device. FM material can be CoFeB, NiFe, Co, Fe or any composite material exhibiting similar magnetic properties. The FM layer can be placed using a sputtered deposition process, known to a person having ordinary skill in the art.

Those skilled in the art will recognize that numerous modifications can be made to the specific implementations described above. The implementations should not be limited to the particular limitations described. Other implementations may be possible.

The invention claimed is:
1. A switching device, comprising:
   a spin-orbit coupling (SOC) layer;
   a pure spin conductor (PSC) layer disposed atop the SOC layer; and
   a ferromagnetic (FM) layer disposed atop the PSC layer, the PSC layer is a ferromagnetic insulator (FMI) configured to funnel spins from the SOC layer onto the FM layer and to further provide a charge insulation so as to substantially eliminate current shunting from the SOC layer while allowing spins to pass through.
2. The switching device of claim 1, further comprising a first terminal disposed near a first end of the SOC layer and a second terminal disposed near a second end of the SOC layer.

3. The switching device of claim 2, the SOC layer comprises a Giant Spin Hall Effect (GSHE) material.

4. The switching device of claim 3, further comprising a normal metal (NM) layer sandwiched between the PSC layer and the FM layer, the NM layer configured to funnel spins from the PSC layer into the FM layer, and wherein the NM layer has a resistivity of between about $1.5 \times 10^{-8}$ Ω·m. to about $3.0 \times 10^{-8}$ Ω·m.

5. The switching device of claim 2, wherein the ratio of $J_s/(\theta_{SH} J_c)$ as a function of spin diffusion length $(\lambda_n)$ is substantially the same based on a charge current density flowing in the SOC layer $(J'_c)$ as compared to a charge current density flowing through the first and second terminals $(J_c)$.

6. A method of manufacturing a switching device, comprising:
   providing a substrate;
   applying a spin-orbit coupling (SOC) layer atop the substrate;
   applying a pure spin conductor (PSC) layer atop the SOC layer, generating an intermediate device;
   patterning the intermediate device so that the area of the PSC layer is a fraction of the area of the SOC layer;
   applying a first terminal disposed near a first end of the SOC layer and a second terminal disposed near a second end of the SOC layer; and
   applying a ferromagnetic (FM) layer disposed atop the PSC layer, the PSC layer is a ferromagnetic insulator (FMI) configured to funnel spins from the SOC layer onto the FM layer and to further provide a charge insulation so as to substantially eliminate current shunting from the SOC layer while allowing spins to pass through.

7. The method of claim 6, the SOC layer comprises a Giant Spin Hall Effect (GSHE) material.

8. The method of claim 6, further comprising the step of applying a normal metal (NM) layer atop the PSC layer after the step of applying the PSC layer, such that the patterning step results in the NM layer to have substantially the same area as that of the PSC layer.

9. The method of claim 8, the NM layer has a resistivity of between about $1.5 \times 10^{-8}$ Ω·m. to about $3.0 \times 10^{-8}$ Ω·m.

10. The method of claim 9, wherein the NM layer comprises one of copper, aluminum, silver, gold, or an alloy constituting a combination thereof.

\* \* \* \* \*